(12) United States Patent
Cho (10) Patent No.: US 8,520,444 B2
(45) Date of Patent: Aug. 27, 2013

(54) NONVOLATILE MEMORY AND METHOD FOR VERIFYING THE SAME

(75) Inventor: Myung Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 199 days.

(21) Appl. No.: 12/974,617

(22) Filed: Dec. 21, 2010

(65) Prior Publication Data

US 2012/0099378 A1    Apr. 26, 2012

(30) Foreign Application Priority Data

Oct. 25, 2010   (KR) .................. 10-2010-0103885

(51) Int. Cl.
  *G11C 16/06*    (2006.01)
  *G11C 16/24*    (2006.01)
  *G11C 16/26*    (2006.01)
  *G11C 16/34*    (2006.01)

(52) U.S. Cl.
  USPC ........... 365/185.25; 365/185.17; 365/185.19; 365/185.22

(58) Field of Classification Search
  USPC ............. 365/185.17, 185.19, 185.22, 185.25
  See application file for complete search history.

(56) References Cited

U.S. PATENT DOCUMENTS

| | | | | |
|---|---|---|---|---|
| 6,128,229 A | * | 10/2000 | Nobukata | 365/185.22 |
| 6,222,763 B1 | * | 4/2001 | Sato et al. | 365/185.03 |
| 7,539,059 B2 | | 5/2009 | Lee et al. | |
| 2004/0105314 A1 | * | 6/2004 | Shibata et al. | 365/189.01 |
| 2006/0209592 A1 | * | 9/2006 | Li et al. | 365/185.03 |
| 2007/0236985 A1 | * | 10/2007 | Edahiro et al. | 365/154 |
| 2008/0055999 A1 | * | 3/2008 | Nakajima et al. | 365/185.18 |
| 2008/0159005 A1 | * | 7/2008 | Lee et al. | 365/185.25 |

FOREIGN PATENT DOCUMENTS

KR    1020110001057    1/2011

OTHER PUBLICATIONS

Notice of Allowance issued by the Korean Intellectual Property Office on Jul. 31, 2012.

* cited by examiner

*Primary Examiner* — J. H. Hur (74) *Attorney, Agent, or Firm* — IP & T Group LLP (57) ABSTRACT

A nonvolatile memory device includes a cell string including a plurality of memory cells connected in series, a bit line connected to the cell string, a voltage sensing unit configured to apply a verify precharge voltage to the bit line in response to a voltage of a sensing node before a verify operation, a voltage transmission unit configured to apply a voltage of the bit line to the sensing node in a verify operation, and a page buffer configured to determine a voltage of the sensing node in response to data stored therein before a verify operation and to change the data in response to a voltage level of the sensing node in the verify operation.

15 Claims, 8 Drawing Sheets

NONVOLATILE MEMORY AND METHOD FOR VERIFYING THE SAME

CROSS-REFERENCE TO RELATED APPLICATIONS

The present application claims priority of Korean Patent Application No. 10-2010-0103885, filed on Oct. 25, 2010, which is incorporated herein by reference in its entirety.

BACKGROUND OF THE INVENTION

Exemplary embodiments of the present invention relate to nonvolatile memory devices, and more particularly, a nonvolatile memory device and a method for driving the same.

Nonvolatile memory devices retain stored data even when power supply thereto is interrupted. Among the nonvolatile memory devices, a floating gate type nonvolatile memory device is being widely used. Here, the nonvolatile memory device is driven using a floating gate that is disposed on a channel region of a substrate and is insulated therefrom. Specifically, the nonvolatile memory device is controlled by shifting the threshold voltage of a memory cell by controlling the amount of charge retained in a conduction band of the floating gate.

When a program voltage is applied to the floating gate, the threshold voltage of the memory cell increases. Here, because of different physical characteristics of individual memory cells in a nonvolatile memory device, the memory cells may have threshold voltages variously ranging in a threshold voltage distribution range. Hereafter, a method for storing data in a memory cell will be described in the context of a flash memory device which is a floating gate type nonvolatile memory device.

A nonvolatile memory device includes a memory cell array that stores data. The memory cell array includes a plurality of memory blocks. Each of the memory blocks includes a plurality of pages. Each of the pages includes a plurality of memory cells. The memory cells are divided into on-cells and off-cells according to threshold voltage distributions. The on-cell is an erased cell and the off-cell is a programmed cell. The nonvolatile memory device performs an erase operation on a memory block by memory block basis and performs a read/write operation on a page by page basis.

Meanwhile, the nonvolatile memory device may store 1-bit data or more in a memory cell. In general, a memory cell storing 1-bit data is called a single-level cell (SLC) and a memory cell storing at least 2-bit data is called a multi-level cell (MLC). The SLC has an erase state and a program state according to threshold voltages. The MLC has an erase state and a plurality of program states according to threshold voltages.

Figure 1:
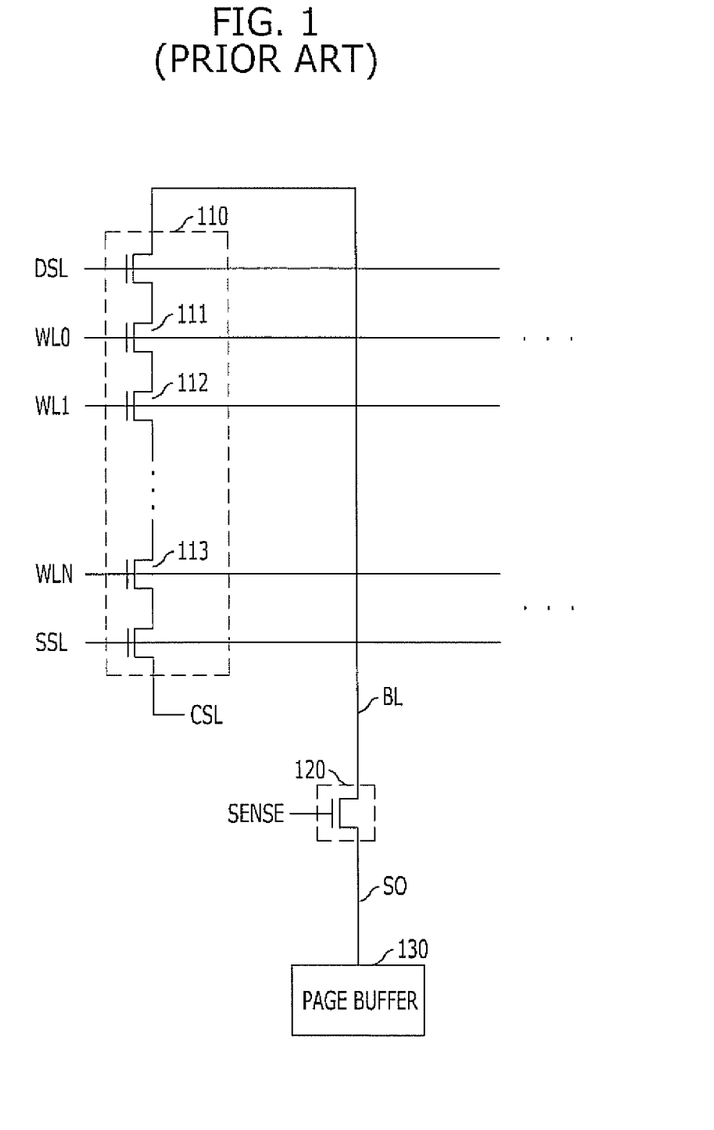
FIG. 1 is a configuration diagram of a conventional nonvolatile memory device.

FIG. 1 is a configuration diagram of a conventional nonvolatile memory device.

Referring to FIG. 1, a nonvolatile memory device includes a cell string 110, a bit line BL, a voltage transmission unit 120, and a page buffer 130. The cell string 110 includes a plurality of memory cells 111, 112 and 113 connected in series. The bit line BL is connected to the cell string 110. The voltage transmission unit 120 is configured to apply a voltage of the bit line BL to a sensing node SO in a verify operation, where the verify operation includes an evaluation operation for connecting a memory cell whose programmed state is to be verified with the bit line and a sensing operation for coupling the bit line and a sense node of a page buffer. The page buffer 130 is configured to determine a voltage of the sensing node SO in response to data stored therein before the verify operation, or to update the data to a logic value corresponding to a voltage level of the sensing node SO in the verify operation.

The cell string 110 means a string structure that is constructed by a series connection between a source select transistor SSL (a transistor receiving an SSL signal) and a drain select transistor (a transistor receiving a DSL signal). Various voltages are applied through a plurality of word lines WL0, WL1 and WLN to the floating gates of the memory cells 111, 112 and 113.

Hereafter, a program/verify operation of a nonvolatile memory device will be described with reference to FIG. 1. Hereafter, a cell to be programmed will be referred to as a target cell, and the program/verify operation will be described by assuming, as an example, that the first memory cell 111 is a target cell.

Program voltages are applied according to an Increment Step Pulse Program (ISPP) scheme. According to an ISPP scheme, a first program voltage is applied to the world line WL1 and a verify operation is performed thereon. As a result of the verify operation, if it is determined to not have been sufficiently programmed, a second program voltage higher than the first program voltage is applied thereto and a verify operation is performed thereon. Repeating an operation of applying a program voltage (hereinafter referred to as a program operation) and an operation of verifying a program pass/fail of the target cell 111, by gradually increasing the program voltage for a subsequent operation, until the target cell 111 is programmed, is called an ISPP scheme.

The verify operation is performed in the following order. The sensing node SO is precharged by the page buffer 130 to a precharge voltage VCC. A precharge bias is applied to the voltage transmission unit 120 to electrically connect the sensing node SO and the bit line BL, and a voltage of the sensing node SO is transmitted to the bit line BL to precharge the bit line BL ("a bit line precharge operation").

When the bit line BL is precharged, a verify voltage is applied to the target cell 111. The verify voltage is to verify a program pass/fail of the target cell 111. A turn-on/pass voltage (that is, a voltage for turning on a transistor) is applied to the floating gates of the other memory cells 112 and 113. If the target cell 111 is programmed, the bit line BL maintains the precharge voltage VCC; and if the target cell 111 is not programmed, the voltage of the bit line BL decreases ("an evaluation operation").

After completion of the evaluation operation, the voltage of the bit line BL indicates the program pass/fail of the target cell 111. A sensing bias is applied to the voltage transmission unit 120 to electrically connect the bit line BL and the sensing node SO, and the voltage of the bit line BL is transmitted to the sensing node SO. The data stored in the page buffer 130 is updated to a data value corresponding to a voltage level of the sensing node SO in a sensing operation.

In the case of 4 KB (kilo byte) memory page, one page includes about 32,000 (4×1024×8) memory cells. Thus, in a program operation, according to the characteristics of memory cells, some memory cells may be program-passed cells and some memory cells may be program-failed cells. In the case of a nonvolatile memory device including multi-level cells, the memory cell of a low target threshold voltage is programmed first and then the memory cell of a high target threshold voltage is programmed. Here, the memory cell having a program/verify operation completed does not requires a precharge of the bit line BL for a verify operation. Conventionally, all bit lines BL included in a page are precharged before the verify operation regardless of whether a program/verify operation on some memory cells is completed. It is useful to reduce a large peak current flowing in the nonvolatile memory device during the bit line (BL) precharge operation and thus, reduce power consumption.

SUMMARY OF THE INVENTION

An embodiment of the present invention is directed to reduce the power consumption and a peak current flowing in a nonvolatile memory device by selectively precharge only a bit line corresponding to a memory cell needing a verify operation when precharging a bit line before a verify operation.

In accordance with an embodiment of the present invention, a nonvolatile memory device includes: a cell string including a plurality of memory cells connected in series; a bit line connected to the cell string; a voltage sensing unit configured to apply a verify precharge voltage to the bit line in response to a voltage of a sensing node before a verify operation; a voltage transmission unit configured to apply a voltage of the bit line to the sensing node in a verify operation; and a page buffer configured to determine a voltage of the sensing node in response to data stored therein before a verify operation and to change the data in response to a voltage level of the sensing node in the verify operation.

The voltage sensing unit may include a first transistor having a drain connected to the bit line, a source connected to an internal node, and a gate connected to receive a verify precharge signal, wherein the verify precharge signal is activated before the verify operation; and a second transistor having a drain connected to the internal node, a source receiving the verify precharge voltage, and a gate connected to receive the voltage of the sensing node.

The voltage transmission unit may include a third transistor having a drain connected to the bit line, a source connected to the sensing node, and a gate coupled to receive a sensing signal, wherein the sensing signal is activated in the verify operation.

In accordance with another embodiment of the present invention, a method for verifying a nonvolatile memory device includes: determining a voltage of a sensing node according to data stored in a page buffer; transmitting a verify precharge voltage to a bit line according to the voltage of the sensing node; changing a voltage of the bit line in response to a determination as to whether a program of a memory cell is completed; connecting the bit line and the sensing node; and changing the data stored in the page buffer in response to a voltage level of the sensing node.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
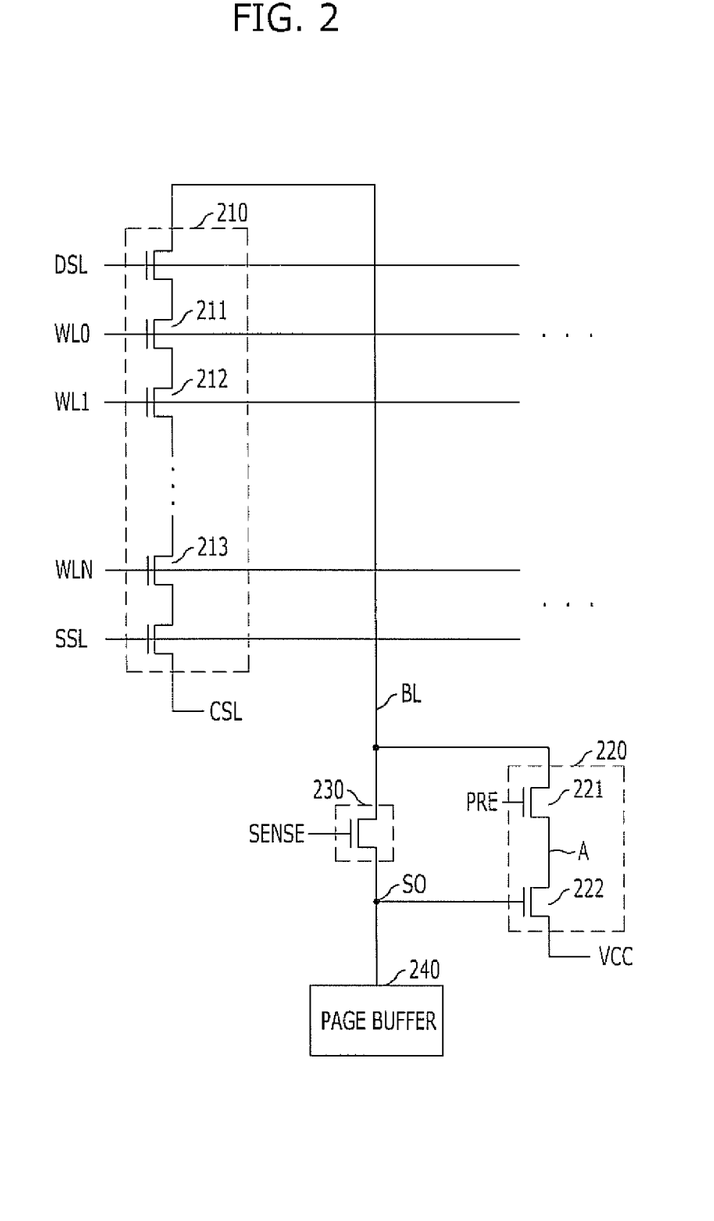
FIG. 2 is a configuration diagram of a nonvolatile memory device in accordance with an embodiment of the present invention.

FIG. 2 is a configuration diagram of a nonvolatile memory device in accordance with an embodiment of the present invention.

Referring to FIG. 2, a nonvolatile memory device includes a cell string 210, a bit line BL, a voltage sensing unit 220, a voltage transmission unit 230, and a page buffer 240. The cell string 210 includes a plurality of memory cells 211, 212 and 213 connected in series. The bit line BL is connected to the cell string 210. The voltage sensing unit 220 is configured to apply/interrupt a verify precharge voltage VCC to the bit line BL in response to a voltage of a sensing node SO before a verify operation. The voltage transmission unit 230 is configured to apply a voltage of the bit line BL to the sensing node SO in a verify operation. The page buffer 240 is configured to determine a voltage of the sensing node SO in response to data stored therein before a verify operation or to update the stored data to a logic value corresponding to a voltage level of the sensing node SO in the verify operation. The cell string 210 means a string structure including memory cells coupled in series between a source select transistor (that is, a transistor receiving an SSL signal) and a drain select transistor (that is, a transistor receiving a DSL signal). Word line voltages are applied through a plurality of word lines WL0, WL1 and WLN to the floating gates of the memory cells 211, 212 and 213.

FIG. 2 illustrates the case where a program/verify voltage is applied to the first word line WL0. Hereafter, a memory cell connected to the first word line WL0 for applying the program/verify voltage will be referred to as a target cell 211. The memory cell is programmed according to an Increment Step Pulse Program (ISPP) scheme.

The data stored in the page buffer 240 has a logic value corresponding to a program-completed status when the target cell 211 is not to be programmed or when there is a need to program the target cell 211 but a program/verify process has already been completed through a program operation. In the first case, the stored data has a logic value corresponding to the program-completed status from the beginning. In the latter case, it has a logic value corresponding to the program-in-progress status at the beginning and changes into a logic value corresponding to the program-completed status upon completion of the program/verify process. That is, when the data stored in the page buffer 240 has a logic value corresponding to the program-completed status, the target cell 211 is not to be programmed.

The data stored in the page buffer 240 has a logic value corresponding to the program-in-progress status when the target cell 211 intended to be programmed has not been completely programmed as a result of the verify operation. That is, when the data stored in the page buffer 240 has a logic value corresponding to the program-in-progress status, the stored data indicates that the target cell 211 is to be programmed.

Hereinafter, with reference to FIGS. 3A to 5B, an operation of a nonvolatile memory device in accordance with an embodiment of the present invent will be described with respect to a verify operation.

Figure 3A:
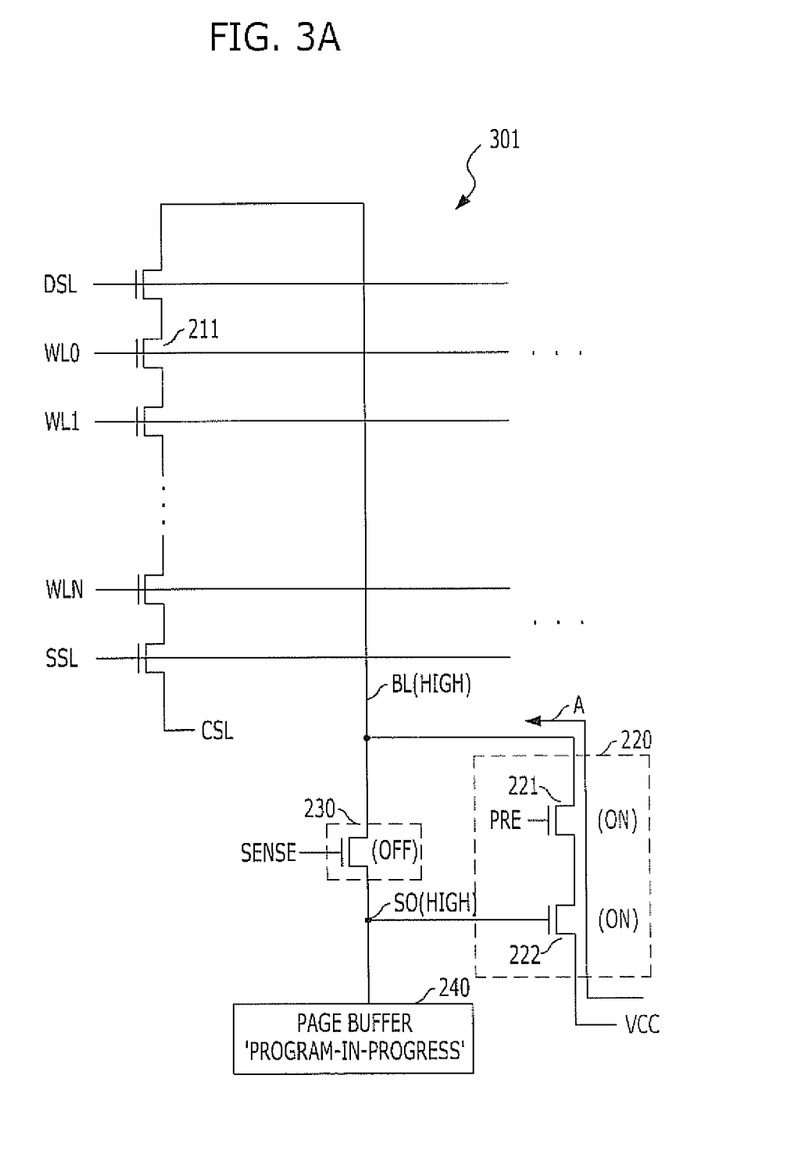
FIGS. 3A and 3B illustrate a bit line (BL) precharge operation of a nonvolatile memory device in accordance with an embodiment of the present invention.
Figure 3B:
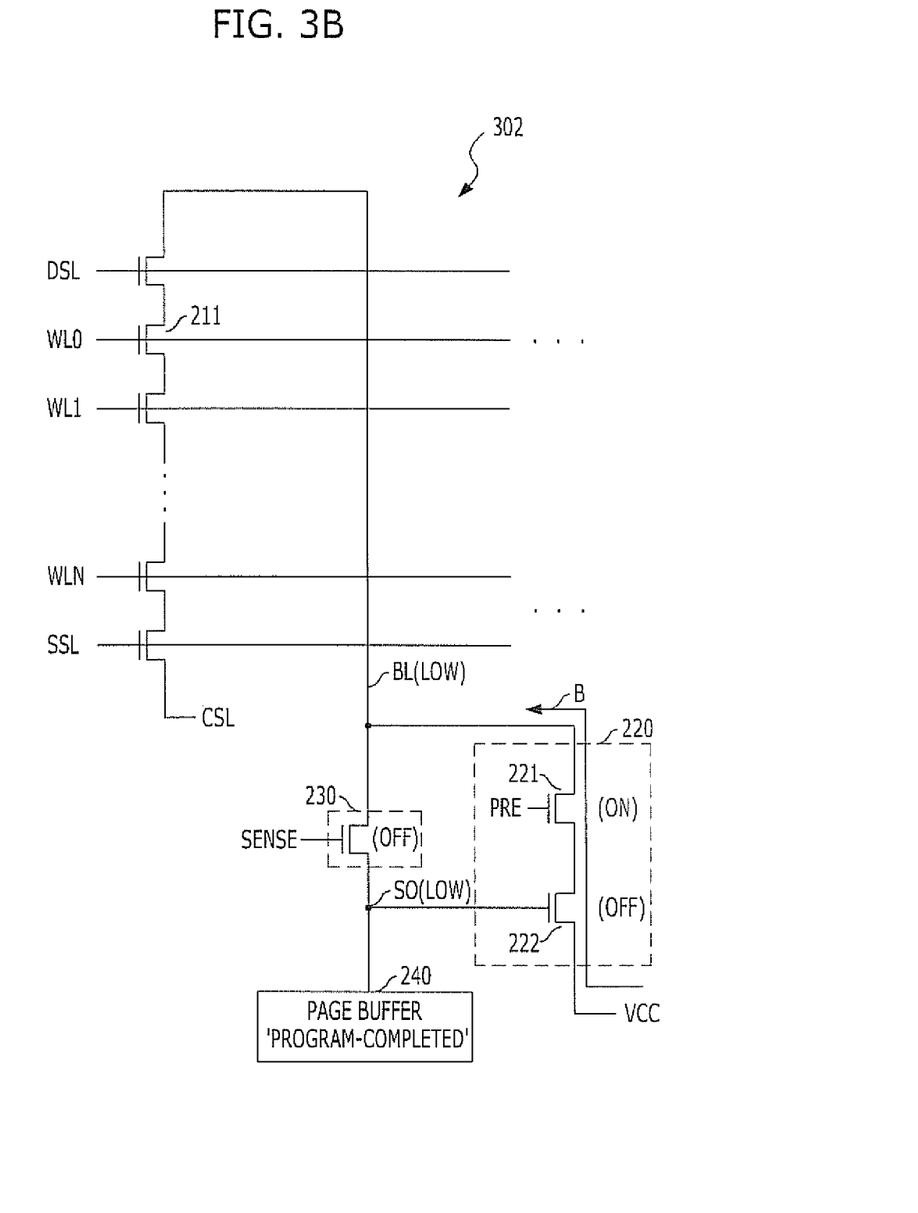

FIGS. 3A and 3B illustrate a bit line (BL) precharge operation of a nonvolatile memory device in accordance with an embodiment of the present invention.

FIG. 3A illustrates the case where the data stored in the page buffer 240 has a logic value corresponding to the program-in-progress status. FIG. 3B illustrates the case where the data stored in the page buffer 240 has a logic value corresponding to the program-completed status. 'HIGH' and 'LOW' represent high level and low level voltages, respectively, and 'ON' and 'OFF' represent whether the transistor is turned on or off, respectively.

Before a verify operation, the page buffer 240 sets the sensing node SO to a first voltage (that is, a high level voltage) or a second voltage (that is, a low level voltage) according to the value of data stored therein. When the data stored in the page buffer 240 has a logic value corresponding to the program-in-progress status, the voltage of the sensing node SO is a high level voltage as shown in FIG. 3A.

When the data stored in the page buffer 240 has a logic value corresponding to the program-completed status, the voltage of the sensing node SO is a low level voltage as shown in FIG. 3B. A first arrow A represents a charge transmission, and a second arrow B represents a charge interruption.

When the voltage of the sensing node SO is determined, the voltage sensing unit 220 applies/interrupts the verify precharge voltage VCC to the bit line BL according to the voltage of the sensing node SO. When the voltage of the sensing node SO has a high level (as shown in FIG. 3A), the verify precharge voltage VCC is applied to the bit line BL. When the voltage of the sensing node SO has a low level (as shown in FIG. 3B), the verify precharge voltage VCC is interrupted. When the verify precharge voltage VCC is interrupted, the voltage of the bit line BL has a low level.

More specifically, when the target cell 211 is to be subjected to a verify operation, the bit line BL is precharged; and when the target cell 211 is not to be subjected to a verify operation, the bit line BL is not precharged. In the precharge operation, the drain select transistor is turned on and the source select transistor is turned off.

Figure 4A:
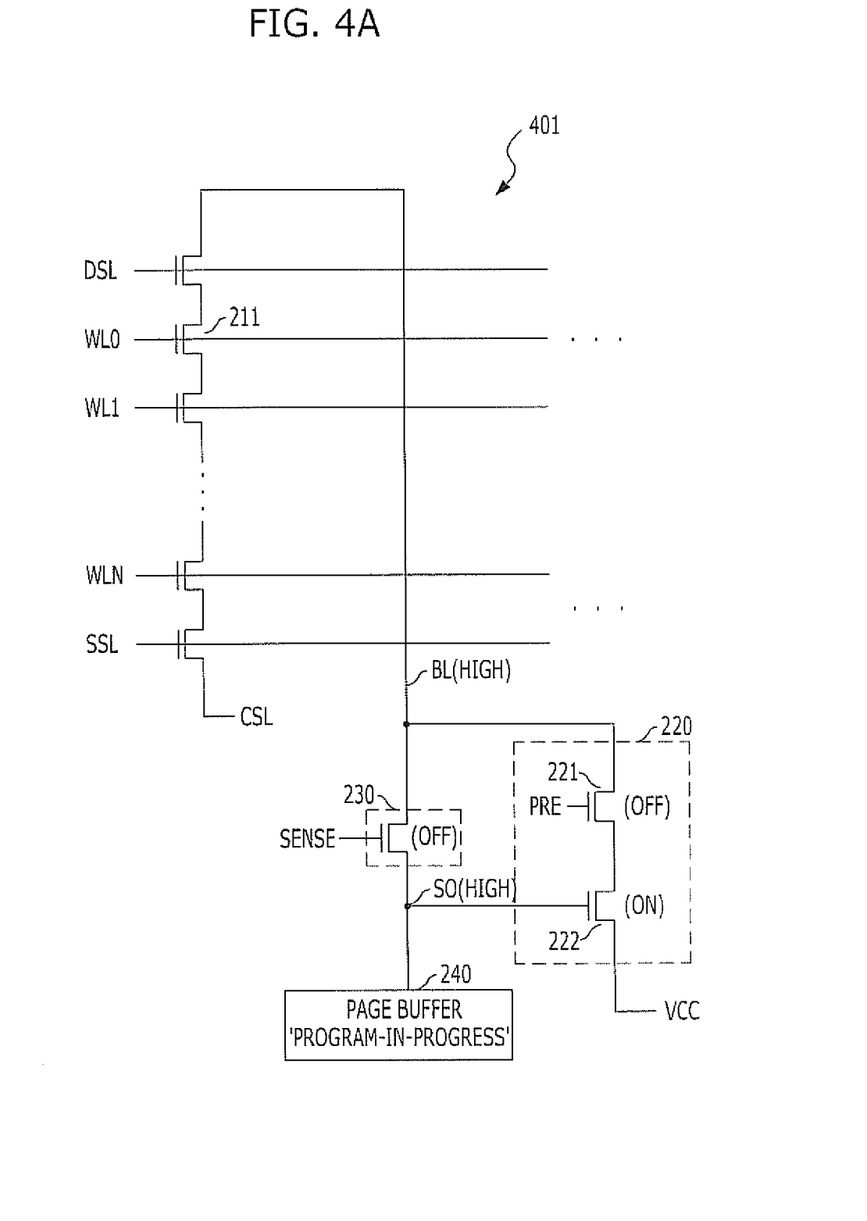
FIG. 4A and 4B illustrate an evaluation operation of a nonvolatile memory device in accordance with an embodiment of the present invention.
Figure 4B:
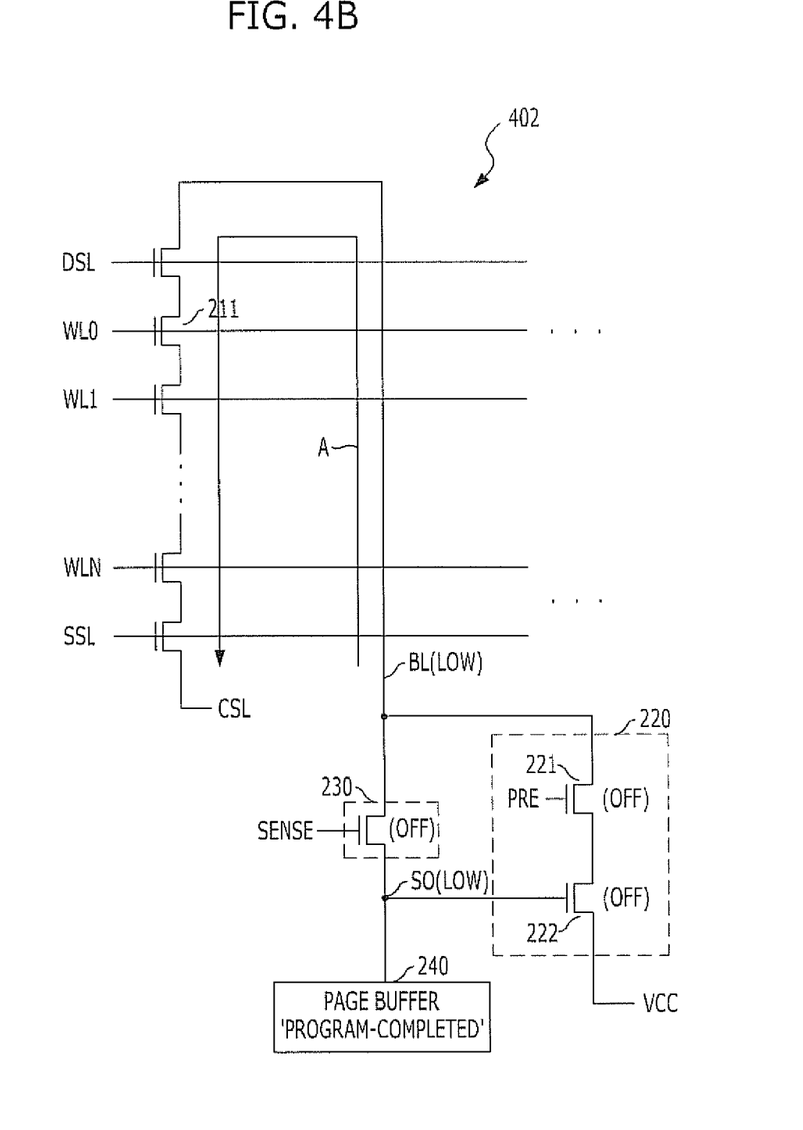

FIGS. 4A and 4B illustrate an evaluation operation of a nonvolatile memory device in accordance with an embodiment of the present invention.

FIG. 4A illustrates the case where the data stored in the page buffer 240 has a logic value corresponding to the program-in-progress status. FIG. 4B illustrates the case where the data stored in the page buffer 240 has a logic value corresponding to the program-completed status. 'HIGH' and 'LOW' represent high and low level voltages, respectively, and 'ON' and 'OFF' represent whether the transistor is turned on or off, respectively.

When the bit line (BL) precharge operation is completed, a verify voltage is applied to the target cell 211. When the verify voltage is applied thereto, the target cell 211 maintains an off state if it is programmed. On the other hand, the target cell 211 is turned on if it is not programmed (for example, when the target cell 211 is not completely programmed).

In FIG. 4A, when a logic value corresponding to the program-in-progress status is stored in the page buffer 240, the voltage of the precharged bit line BL maintains a high level if the target cell 211 is programmed. In FIG. 4B, the voltage of the precharged bit line BL changes into a low level if the target cell 211 is not programmed. FIG. 4A illustrates the case where the voltage of the bit line BL maintains a high level if a program operation of the target cell 211 is completed.

More specifically, if a logic value corresponding to the program-completed status is stored in the page buffer 240 (FIG. 4B), the voltage of the bit line BL maintains a low level when a verify voltage is applied to the target cell 211.

Both the drain select transistor and the source select transistor are turned on in an evaluation operation. This is to provide a discharge path from the precharged bit line BL if the target cell 211 is not programmed.

Figure 5A:
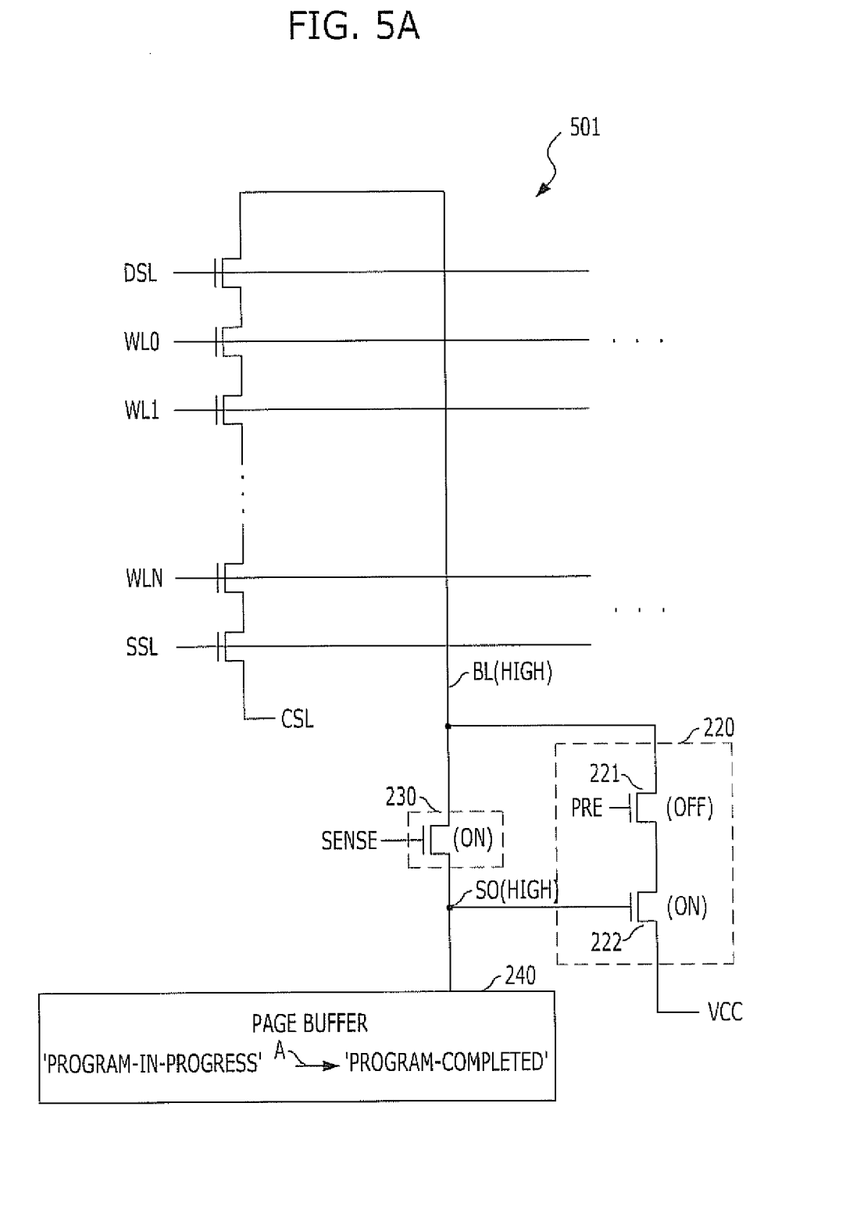
FIG. 5A and 5B illustrate a sensing operation of a nonvolatile memory device in accordance with an embodiment of the present invention.
Figure 5B:
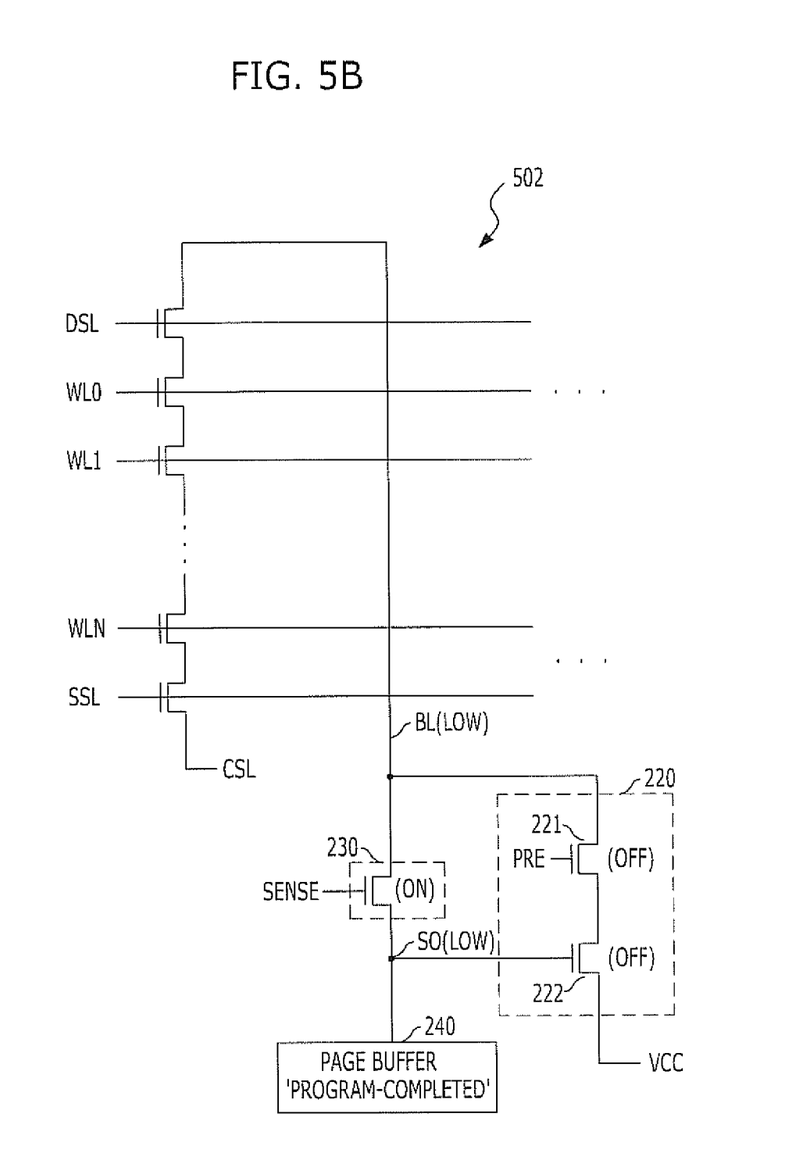

FIGS. 5A and 5B illustrate a sensing operation of the nonvolatile memory device in accordance with an embodiment of the present invention.

FIG. 5A illustrates the case where the data stored in the page buffer 240 has a logic value corresponding to the program-in-progress status. FIG. 5B illustrates the case where the data stored in the page buffer 240 has a logic value corresponding to the program-completed status. 'HIGH' and 'LOW' represent high and low level voltages, respectively, and 'ON' and 'OFF' represent whether the transistor is turned on or off, respectively.

When an evaluation operation is completed by turning on the drain select transistor, a sensing signal SENSE is activated and the voltage transmission unit 230 electrically connects the bit line BL to the sensing node SO. Accordingly, the voltage of the bit line BL is transmitted to the sensing node SO. The voltage transmission unit 230 includes a third transistor 230 that has a drain connected to the bit line BL, a source connected to the sensing node SO, and a gate input corresponding to the sensing signal SENSE that is activated in the verify operation.

In FIG. 5A, when a logic value corresponding to the program-in-progress status is stored in the page buffer 240, the voltage levels of the sensing node SO and the bit line BL in a sensing operation are determined according to whether the target cell 211 is programmed or not. The page buffer 240 updates the data stored therein to a logic value corresponding to the voltage level of the sensing node SO. When the voltage of the sensing node SO has a high level, the data of the page buffer 240 is updated to a logic value corresponding to the program-completed status; and the voltage of the sensing node SO has a low level, the data of the page buffer 240 maintains a logic value corresponding to the program-in-progress status. FIG. 5A illustrates the case where a program operation of the target cell 211 is completed and the data stored in the page buffer 240 is updated from a logic value corresponding to the program-in-progress status to a logic value corresponding to the program-completed status. For example, arrow A indicates that the data stored in the page buffer 240 is updated from a logic value corresponding to the program-in-progress status to a logic value corresponding to the program-completed status.

In FIG. 5B, when the data stored in the page buffer 240 has a logic value corresponding to the program-completed status, the voltages of the sensing node SO and the bit line BL in a sensing operation have a low level. When the data stored in the page buffer 240 has a logic value corresponding to the program-completed status, the stored logic value is maintained. Accordingly, the value of data stored in the page buffer 240 maintains a logic value corresponding to the program-completed status.

The verify operation includes a sensing operation and an evaluation operation. As described above, whether to precharge the bit line BL is determined according to the value of data stored in the page buffer 240. When the data has a logic value corresponding to the program-completed status, the bit line BL is not precharged; and when the data has a logic value corresponding to the program-in-progress status, the bit line BL is precharged. Accordingly, when a verify operation is performed on a page by page basis, a bit line coupled to a subject memory cell that is not to be programmed and verified is not precharged. Thus, the power consumption and a peak current flowing in the nonvolatile memory device may be reduced.

When the memory cells 211, 212 and 213 include multi-level cells, a nonvolatile memory device according to the present invention can effectively reduce the power consumption and the peak current. Hereafter, a description will be given of an operation in the case that the nonvolatile memory device according to an exemplary embodiment of the present invention includes multi-level cells.

For example, in a nonvolatile memory device including multi-level cells, a first target cell is programmed to a first program state and a second target cell is programmed to a second program state. Here, a threshold voltage of the second program state is higher than a threshold voltage of the first program state. In this case, a first program process for programming the first target cell to the first program state is performed first, and a second program process for programming the second target cell to the second program state is performed after completion of the first program process. Thus, the program process is performed in ascending order of the threshold voltage of the program state. The program process means an operation process of the nonvolatile memory device that includes a program operation and a verify operation that are repeated until the completion of the programming of the target cell.

When the first program process is completed, the first target cell is programmed to the first program state. In the second program process, because the first target cell is already programmed and verified, the data stored in the page buffer 240 corresponding to the first target cell has a logic value corresponding to the program-completed status, Also, because the second target cell is still to be programmed, the data stored in the page buffer 240 corresponding to the second target cell has a logic value corresponding to the program-in-progress status, Accordingly, in the verify operation of the second program process, the bit line BL corresponding to the first target cell is not precharged and the bit line BL corresponding to the second target cell is precharged. In this manner, the bit line BL corresponding to the memory cell, which is already programmed and verified, is not precharged in the verify operation of the next program process. Accordingly, the nonvolatile memory device according to the present invention can greatly reduce the power consumption and the peak current.

The configuration and operation of the voltage sensing unit 220 for a nonvolatile memory device including multi-level cells will be described below with reference to FIGS. 2, 3A and 3B.

Referring to FIG. 2, the voltage sensing unit 220 includes a first transistor 221 and a second transistor 222. The first transistor 221 has a drain connected to the bit line BL, a source connected to an internal node A, and a gate input corresponding to a verify precharge signal PRE activated before a sensing operation. The second transistor 222 has a drain connected to the internal node A, a source receiving the verify precharge voltage VCC, and a gate input corresponding to the voltage of the sensing node SO. The verify precharge signal PRE is activated in a bit line (BL) precharge operation.

In FIG. 3A, for the bit line (BL) precharge operation, the verify precharge signal PRE is activated to turn on the first transistor 221. When the voltage of the sensing node SO has a high level, the second transistor 222 is turned on. When the second transistor 222 is turned on, the verify precharge voltage VCC is applied to the bit line BL. When the verify precharge voltage VCC is applied to the bit line BL, the bit line BL is precharged to a high level.

In FIG. 3B, when the voltage of the sensing node SO has a low level, the second transistor 222 is turned off. Accordingly, the verify precharge voltage VCC is not applied to the bit line BL. Thus, the bit line BL is not precharged to a high level.

In this manner, in the bit line (BL) precharge operation, the voltage sensing unit 240 senses the voltage of the sensing node SO to determine whether to precharge the bit line BL.

A program operation of the nonvolatile memory device in accordance with an embodiment of the present invent will be more specifically described below with reference to FIGS. 2 to 5B.

The program operation refers to a series of processes for changing the threshold voltage by applying a program voltage to the target cell 211. Before the program operation, the page buffer 240 determines a voltage of the sensing node SO according to a value of the data stored therein. When the data stored in the page buffer 240 has a logic value corresponding to the program-completed status, the page buffer 240 precharges the sensing node SO to a high level (which level is opposite of what is shown in FIG. 3A). When the data stored in the page buffer 240 has a logic value corresponding to the program-completed status, the page buffer 240 precharges the sensing node SO to a low level (which level is opposite of what is shown in FIG. 3B).

The voltage transmission unit 230 controls a voltage of the bit line BL according to the voltage of the sensing node SO. Thus, when the data stored in the page buffer 240 has a logic value corresponding to the program-completed status, the bit line BL has a precharge voltage VCC; and when the data stored in the page buffer 240 has a logic value corresponding to the program-in-progress status, the bit line BL has a ground voltage GND. When the bit line BL is precharged to VCC, even if a program voltage is applied to the target cell 211, the threshold voltage of the target cell 211 does not change. When the bit line BL has a ground voltage, if a program voltage is applied to the target cell 211, the threshold voltage of the target cell 211 increases. That is, the target cells 211 are not programmed when the data stored in the page buffer 240 corresponding thereto has a logic value corresponding to the program-completed status. The target cells 211 are programmed when the data stored in the page buffer 240 corresponding thereto has a logic value corresponding to the program-in-progress status.

According to the above description, the verify operation is described first. However, in an ISPP scheme, a program operation may be performed before a verify operation.

A verify operation of a nonvolatile memory device in accordance with an embodiment of the present invent will be described below with reference to FIGS. 2 to 5B.

A method for verifying a nonvolatile memory device according to an exemplary embodiment of the present invention includes: determining a voltage of a sensing node SO according to data stored in a page buffer 240; transmitting/interrupting a verify precharge voltage VCC to a bit line BL according to the voltage of the sensing node SO; determining a voltage of the bit line BL according to the program pass/fail of a memory cell; sharing a charge between the bit line BL and the sensing node SO; and updating the data stored in the page buffer 240 according to a voltage level of the sensing node SO.

(1) Determining the Voltage of the Sensing Node SO

In reference to FIG. 3A, in determining the voltage of the sensing node SO, when the data stored in the page buffer 240 has a logic value corresponding to the program-in-progress status, the voltage of the sensing node SO has a first voltage (a high level voltage as shown). In reference to FIG. 3B, when the data stored in the page buffer 240 has a logic value corresponding to the program-completed status, the voltage of the sensing node SO has a second voltage (a low level voltage as shown). This is to turn on/off the second transistor of the voltage sensing unit 220 according to the value of the data stored in the page buffer 240.

(2) Transmitting/interrupting the Verify Precharge Voltage VCC to the Bit Line BL According to the Voltage of the Sensing Node SO In this operation, the verify precharge signal PRE is activated to turn on the first transistor 221. In FIG. 3A, when the voltage of the sensing node SO has a high level, the second transistor 222 is also turned on to apply the verify precharge voltage VCC to the bit line BL. Accordingly, the bit line BL is precharged to a high level. In FIG. 3B, when the voltage of the sensing node SO has a low level, the second transistor 222 is turned off and the verify precharge voltage VCC is not transmitted to the bit line BL. Accordingly, the bit line BL is not precharged. The operations (1) and (2) correspond to the bit line (BL) precharge operation. Upon completion of the bit line (BL) precharge operation, the verify precharge signal PRE is deactivated.

(3) Determining the a Voltage of the Bit Line BL According to the Program pass/fail of a Memory Cell In reference to FIG. 4A, in determining the a voltage of the bit line BL according to the program pass/fail of a memory cell, when the data stored in the page buffer 240 has a logic value corresponding to the program-in-progress status, if the target cell 211 is programmed, the voltage of the bit line BL maintains a high level. If the target cell is not programmed, the voltage of the bit line BL decreases to a low level. When the data stored in the page buffer 240 has a logic value corresponding to the program-completed status (FIG. 4B), the bit line BL is not precharged. The operation (3) corresponds to the evaluation operation.

(4) Sharing a Charge Between the Bit Line BL and the Sensing Node SO

In this operation, when the sensing signal SENSE is activated, the bit line BL and the sensing node SO are electrically connected and the voltage of the bit line BL determined in the operation (3) is transmitted to the sensing node SO. When the voltage of the bit line BL has a high level, the voltage of the sensing node SO has a high level. When the voltage of the bit line BL has a low level, the voltage of the sensing node SO has a low level.

(5) Updating the Data Stored in the Page Buffer 240 According to a Voltage Level of the Sensing Node SO In this operation, when the data stored in the page buffer 240 has a logic value corresponding to the program-in-progress status (FIG. 5A), if the voltage of the sensing node SO decreases to a low level according to the operation (4), the data stored in the page buffer 240 maintains a logic value corresponding to the program-in-progress status. If the voltage of the sensing node SO becomes a high level, the data stored in the page buffer 240 is updated to a logic value corresponding to the program-completed status. If the data stored in the page buffer 240 maintains a logic value corresponding to the program-in-progress status, the bit line BL is again precharged in the next verify operation. If the data stored in the page buffer 240 is updated to a logic value corresponding to the program-completed status, the bit line BL is not precharged from the next verify operation.

When the data stored in the page buffer 240 has a logic value corresponding to the program-completed status (FIG. 5B), the data stored in the page buffer 240 maintains a logic value corresponding to the program-completed status.

The conventional nonvolatile memory device performs only an operation of precharging/not precharging the bit line according to the value of the data stored in the page buffer before applying program pulse when performing the program operation. However, the nonvolatile memory device according to the present invention applies the program pulses and also performs an operation of precharging/not precharging the bit line BL according to the value of the data stored in the page buffer 240 before the verify operation. Through this method, the bit line BL is not precharged if a subject memory cell coupled to the bit line BL is not to be programmed. As described above, the nonvolatile memory device according to the present invention precharges, for example, only a bit line corresponding to a memory cell to be programmed before a verify operation, thereby reducing the power consumption and the peak current flowing therein.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
  a cell string including a plurality of memory cells connected in series;
  a bit line connected to the cell string;
  a voltage sensing unit configured to apply a verify precharge voltage to the bit line in response to a voltage of a sensing node before a verify operation;
  a voltage transmission unit configured to apply a voltage of the bit line to the sensing node in the verify operation; and
  a page buffer configured to determine a voltage of the sensing node in response to data stored therein before the verify operation and to change the data in response to a voltage level of the sensing node in the verify operation,
  wherein the voltage sensing unit precharges the bit line based on the data stored in the page buffer without connecting the sensing node and the bit line.

2. The nonvolatile memory device of claim 1, wherein when the voltage of the sensing node is a first voltage, the voltage sensing unit is configured to apply the verify precharge voltage to the bit line, and when the voltage of the sensing node is a second voltage, the voltage sensing unit is configured to disable a supply of the verify precharge voltage to the bit line.

3. The nonvolatile memory device of claim 2, wherein, before the verify operation, the page buffer is configured to set the voltage of the sensing node to one of the first voltage and the second voltage that corresponds to a logic value of the data stored therein.

4. The nonvolatile memory device of claim 2, wherein the first voltage is a high level voltage and the second voltage is a low level voltage.

5. The nonvolatile memory device of claim 1, wherein the memory cell is programmed according to an increment step pulse program (ISPP) scheme for increasing a program voltage by a step voltage each time the programming of a memory cell is repeated.

6. The nonvolatile memory device of claim 1, wherein the data stored in the page buffer is changed after detecting a change in a programmed state of a target memory cell of the memory cells.

7. The nonvolatile memory device of claim 1, wherein the voltage sensing unit comprises:
  a first transistor having a drain connected to the bit line, a source connected to an internal node, and a gate connected to receive a verify precharge signal, wherein the verify precharge signal is activated before the verify operation; and a second transistor having a drain connected to the internal node, a source receiving the verify precharge voltage, and a gate connected to receive the voltage of the sensing node.

8. The nonvolatile memory device of claim 7, wherein when the first transistor and the second transistor are turned on, the verify precharge voltage is applied to the bit line.

9. The nonvolatile memory device of claim 7, wherein the voltage transmission unit comprises a third transistor having a drain connected to the bit line, a source connected to the sensing node, and a gate coupled to receive a sensing signal, wherein the sensing signal is activated in the verify operation.

10. The nonvolatile memory device of claim 1, wherein the stored data of the page buffer indicates whether a program of a target memory cell of the cell string is completed and the voltage sensing unit is configured to apply the verify precharge voltage to the bit line in response to the stored data of the page buffer.

11. The nonvolatile memory device of claim 9, wherein, if the stored data of the page buffer indicates that a program of a target memory cell of the cell string is completed, the voltage sensing unit is configured to disable a supply of the verify precharge voltage to the bit line in response to the stored data of the page buffer.

12. A method for verifying a nonvolatile memory device, comprising:

determining a voltage of a sensing node according to data stored in a page buffer;

transmitting a verify precharge voltage to a bit line in response to the voltage of the sensing node;

changing a voltage of the bit line in response to a determination as to whether a program of a memory cell is completed;

connecting the bit line and the sensing node; and changing the data stored in the page buffer in response to a voltage level of the sensing node;

wherein the bit line is charged based on the data stored in the page buffer without connecting the bit line and the sensing node.

13. The method of claim 12, wherein in the determining of the voltage of the sensing node, the voltage of the sensing node is determined to be one of a first voltage and a second voltage that corresponds to a logic value of the data stored in the page buffer.

14. The method of claim 13, wherein in the transmitting of the verify precharge voltage to the bit line, the verify precharge voltage is transmitted to the bit line when the voltage of the sensing node is the first voltage and the verify precharge voltage is not transmitted to the bit line when the voltage of the sensing node is the second voltage.

15. The method of claim 13, wherein the first voltage is a high level voltage and the second voltage is a low level voltage.

* * * * *